United States Patent [19]

Nishizawa

[11] Patent Number: 5,377,158
[45] Date of Patent: Dec. 27, 1994

[54] MEMORY CIRCUIT HAVING A PLURALITY OF INPUT SIGNALS

[75] Inventor: Takahiko Nishizawa, Tokyo, Japan

[73] Assignee: NEC Corporation, Tokyo, Japan

[21] Appl. No.: 190,454

[22] Filed: Feb. 2, 1994

[30] Foreign Application Priority Data

Feb. 3, 1993 [JP] Japan .................................. 5-016010

[51] Int. Cl.$^5$ .............................................. G11C 8/00
[52] U.S. Cl. .................. 365/233; 365/189.05; 326/95
[58] Field of Search ............... 365/233, 189.05, 230.08, 365/230.01, 230.05; 307/452, 481

[56] References Cited

U.S. PATENT DOCUMENTS 5,107,465  4/1992  Fung ................................ 365/230.08
5,173,626 12/1992  Kudon .............................. 307/481
5,229,965  7/1993  Inoue .............................. 365/189.04

OTHER PUBLICATIONS

K. Furuya et al., "Introduction to Fault Tolerance", Ohm Ltd. (Japan), Sep. 15, 1988.

Primary Examiner—Eugene R. LaRoche
Assistant Examiner—A. Zarabian
Attorney, Agent, or Firm—Sughrue, Mion, Zinn, Macpeak & Seas

[57] ABSTRACT

A multi-input memory circuit including a first input gate for selecting one of a plurality of data signals, a first inverting gate for receiving the output of the first input gate as an input, a first feedback gate, which has a structure of a vertical lamination inverter, receives a plurality of clock signals, inverted signals of those clock signals and the output of the first inverting gate, and has its output terminal connected to the output terminal of the first input gate, and a second input gate, which has a vertical lamination inverter structure, and receives a plurality of clock signals, inverted signals of those clock signals and the output of the first input gate, and a second feedback gate, which has a horizontal lamination inverter structure, receives a plurality of clock signals, inverted signals of those clock signals and the output of the second inverting gate, and has its output terminal connected to the output terminal of the second input gate. With this structure, a system of matching the phases of control signals for the individual gates with one another is latently incorporated in the multi-input edge-trigger type memory circuit, thereby preventing data dropout.

20 Claims, 3 Drawing Sheets

MEMORY CIRCUIT HAVING A PLURALITY OF INPUT SIGNALS

BACKGROUND OF THE INVENTION

1. Field of the Invention

The present invention relates to a memory circuit, and, more particularly, to a multi-input memory circuit which has plural sets of clock signals and data signals and selectively uses an arbitrary set of clock and data signals to hold and output data.

2. Description of the Related Art

Figure 1:
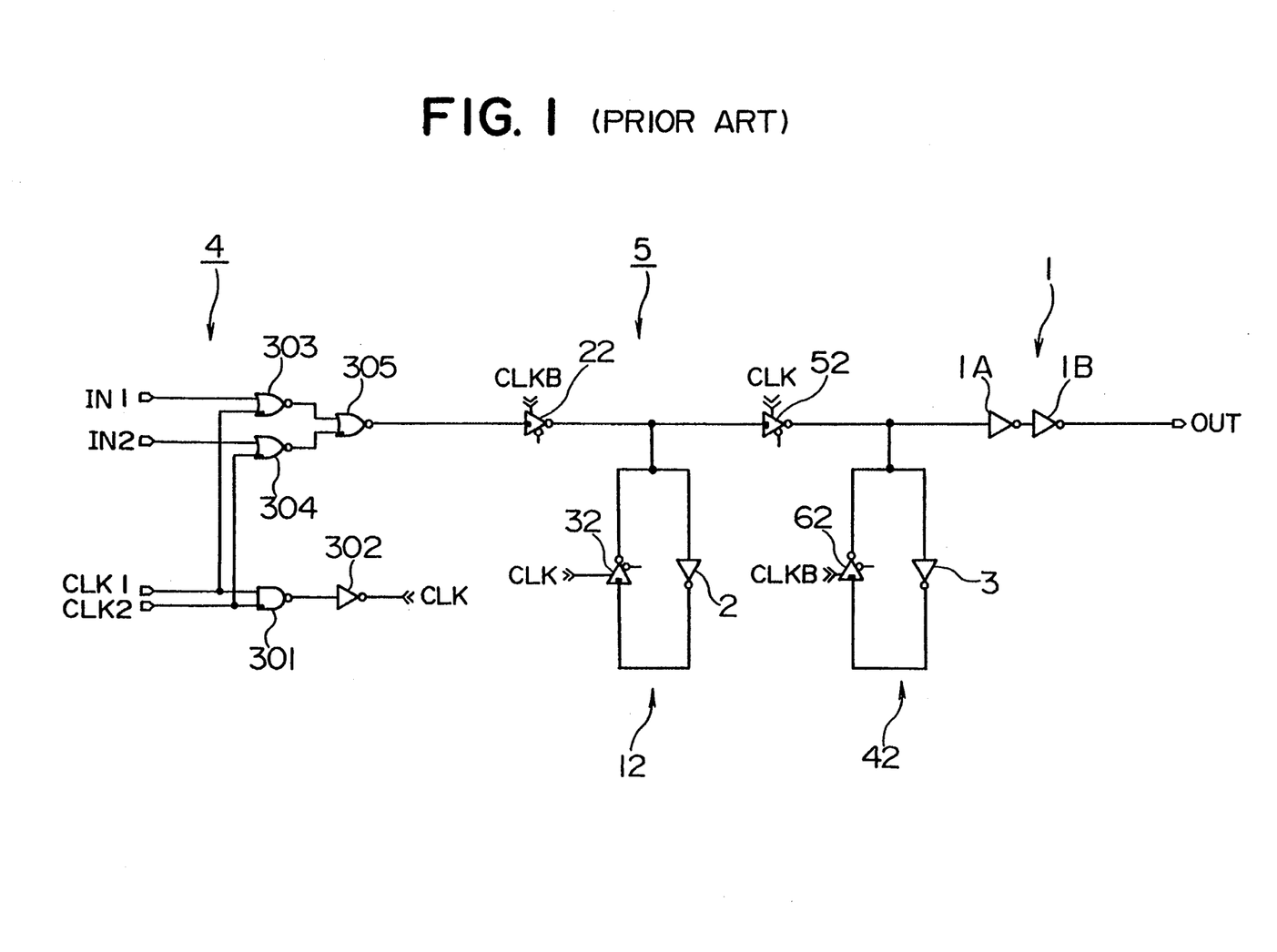
FIG. 1 is a circuit diagram showing one example of a conventional memory circuit.

FIG. 1 is a circuit diagram showing an example of a conventional memory circuit of the above type. This circuit has two systems of inputs (a data signal IN1 and clock signal CLK1, and a data signal IN2 and clock signal CLK2), and fixes the clock signal of a non-selected system to a logic value 1 so as to hold and output data of the selected system in synchronism with the rising edge of the clock signal of the selected system. This circuit mainly comprises an input circuit 4 and a latch 5 which is triggered at the rising edge of a clock signal.

To begin with, the one-input latch 5 will be described. This latch 5 has a first input gate 22, which receives a signal from the input circuit 4 and is enabled or disabled by an inverted signal CLKB of a clock signal CLK, a first hold circuit 12, which receives a signal from this first input gate 22, a second input gate 52, which is enabled or disabled by the clock signal CLK, a second hold circuit 42, which receives a signal from the input circuit 4 or the first hold circuit 12 via the second input gate 52, and an output circuit 1. The one-input latch 5 designed as above holds and outputs data in synchronism with the rising edge of the clock signal.

The first hold circuit 12 receives the output signal of the input circuit 4 from the first input gate 22, which is controlled by the inverted signal CLKB of the clock signal CLK, and holds the inverted signal of that input signal by means of a first feedback loop, which comprises a first inverting gate 2 and a first feedback gate 32. The second hold circuit 42 receives the output of the first hold circuit 12 from the second input gate 52, which is controlled by the clock signal CLK, and holds the inverted signal of that input signal or the value of the output signal from the input circuit 4 by means of a second feedback loop, which comprises a second inverting gate 3 and a second feedback gate 62.

The output circuit 1, which has an inverter 1A and an inverter 1B, drives a load (not shown) at the subsequent stage and guarantees the function of the second feedback loop. The first inverting gate 2 and second inverting gate 3 have a structure of an inverter, and the first feedback gate 32 and second feedback gate 62 have a structure of a clocked inverter.

The first input gate 22 and second input gate 52 both have a structure of a clocked inverter, and the first input gate 22 is enabled and the second input gate 52 is disabled during a period in which the clock signal CLK has a logic value 0. Accordingly, while the first feedback loop (first hold circuit 12) is holding the data signal, the second feedback loop (second hold circuit 42) keeps holding and outputting data of the previous cycle. While the clock signal CLK has a logic value 1, the first input gate 22 is disabled and the second input gate 52 is enabled. Accordingly, the data signal is cut off from the memory circuit and at the same time the data held in the first feedback loop (first hold circuit 12) is sent to the second feedback loop (second hold circuit 42). The second feedback loop (second hold circuit 42) holds and outputs this received data.

Through the above operation, when the clock signal CLK changes its logic value to "1" from "0", the data signal before the transition can be kept being output for one cycle after the transition. The "clocked inverter" is a logic gate, which functions as an inverter only when the control signal has a logic value 1 and whose output has a high resistance when the control signal has a logic value 0.

The input circuit 4 will now be described. This input circuit 4 selects one system of data from two systems of data, and outputs it to the above-described one-input latch 5. The two systems of clock signals CLK1 and CLK2 input to this input circuit 4 are input to an AND gate, which comprises a NAND gate 301 and an inverter 302, to be converted into one system of a clock signal. The data signals IN1 and IN2 are input to a select gate, which comprises three NOR gates 303, 304 and 305, to be converted into one system of a data signal.

This select gate has a structure of a multiplexer, which becomes active when the control signal has a logic value 0. For example, to use one set of the clock signal CLK1 and data signal IN1, the clock signal CLK2 is fixed to a logic value 1. In this case, the AND gate comprising the NAND gate 301 and inverter 302 always outputs the clock signal CLK1. As the clock signal CLK2 always has a logic value 1, the NOR gate 304 always outputs a logic value 0, causing the NOR gate 305 to always output the output of the NOR gate 304. That is, the clock signal CLK becomes the clock signal CLK1, and the output of the NOR gate 305 becomes the data signal IN1. Through the above operation, a memory circuit with multi-input signals can be accomplished.

As the scale of semiconductor integrated circuits become larger and their designs become complex today, it becomes difficult to provide a detailed evaluation of the internal structure of an integrated circuit. The number of integrated circuits in which a self-evaluating device is incorporated is increasing. Of those circuits, a so-called scan bus system is employed in many semiconductor integrated circuits due to its relatively simple structure and its easy evaluation method.

The scan bus system is a method of evaluating the internal structure of an integrated circuit by connecting latches or registers to be evaluated in a row and outputting their contents as serial data. According to this method, while the individual latches hold and output received data in synchronism with a clock signal from the system in normal operation mode, each of the latches connected in a row shifts its content to the next latch, thereby outputting their contents as serial data, in synchronism with a test clock signal in test mode. Accomplishing this function, therefore, requires a memory circuit which selectively uses the logic connection in normal operation mode or the connection of the latches for the test mode.

There are several possible ways to select the normal operation or an operation in test mode. What relates to this invention is a memory circuit which is suitable particularly for the case where the normal operation or the test-mode operation is selected by the simplest system of disabling a test clock signal in normal operation mode and disabling a clock signal for the normal operation in test mode.

Since the above-described conventional multi-input memory circuit requires a signal coming through a logic gate as a clock signal and uses a separate system of circuit to select data, however, it has the following shortcomings.

First, the clock signal lags by a delay caused by traveling through the NAND gate 301 and inverter 302, so that the delay of the clock signal is wasted every cycle, as compared with an ordinary memory circuit of a single-system type.

Secondly, since the data signal and clock signal pass separate logics, it is difficult to design the timings for the setup and hold.

Particularly, the skew and delay of the clock signal is always the bottleneck on the design in recent high-speed semiconductor integrated circuits, and the driver and the traveling path for the clock signal are designed very prudently. Therefore, the circuit configuration which causes the clock signal to pass through a gate and the circuit configuration which disturbs the regularity of that timing, as of the above-described conventional memory circuit, disadvantageously increase a burden on the circuit design.

SUMMARY OF THE INVENTION

It is therefore a primary object of the present invention to provide an edge-trigger type multi-input memory circuit in which a system of matching the phases of control signals for individual gates with one another is latently incorporated to thereby avoid a possibility of causing dropout of data.

It is another object of this invention to provide a multi-input memory circuit which reduces a burden on the circuit design.

According to this invention, there is provided a multi-input memory circuit for receiving a plurality of clock signals and a plurality of data signals paired respectively with the plurality of clock signals, and selectively using an arbitrary set of clock and data signals to store and output data, which circuit comprises a first input gate for receiving inverted signals of the plurality of clock signals and the plurality of data signals, and selectively outputting one of the plurality of data signals based on the plurality of the inverted signals of the clock signals; a first feedback loop having a first inverting gate and a first feedback gate having an input terminal connected to an output terminal of the first inverting gate and an output terminal connected to an input terminal thereof, the input terminal of the first inverting gate and the output terminal of the first feedback gate being connected to an output terminal of the first input gate; a second input gate for receiving an output of the first input gate and outputting the output after inversion; and a second feedback loop having a second inverting gate and a second feedback gate having an input terminal connected to an output terminal of the second inverting gate and an output terminal connected to an input terminal thereof, the input terminal of the second inverting gate and the output terminal of the second feedback gate being connected to an output terminal of the second input gate.

The first feedback gate includes a first transistor row having a series circuit having series-connected first conductivity type MOS transistors for receiving inverted signals of the plurality of clock signals respectively as gate inputs, and a first conductivity type MOS transistor for receiving an output of the first inverting gate as a gate input, the series circuit of first conductivity type MOS transistors being connected in series to the latter first conductivity type MOS transistor, and a second transistor row having a series circuit having series-connected second conductivity type MOS transistors for receiving the plurality of clock signals respectively as gate inputs, and an second conductivity type MOS transistor for receiving the output of the first inverting gate as a gate input, the series circuit of second conductivity type MOS transistors being connected in series to the latter second conductivity type MOS transistor, a drain electrode of a first end of the first transistor row and a drain electrode of a first end of the second transistor row being connected together to be an output terminal, a source electrode of a second end of the first transistor row being fixed to a potential of a high-potential power source, and a source electrode of a second end of the second transistor row being fixed to a ground potential.

According to this invention, since the control signal for the first input gate and the control Signal for the second input gate work in the same phase, data dropout can be avoided. In the case where the logic value of the clock signal changes from "1" to "0", when the first input gate is enabled, the second input gate is disabled at the same time, preventing any data dropout.

Even if there is a skew between the clock signal and its inverted signal, the circuit configuration of this invention will prevent data dropout.

Accordingly, this invention has such an advantage as to eliminate the need for fine adjustment for preventing data dropout and the need for re-checking.

DETAILED DESCRIPTION OF THE PREFERRED EMBODIMENTS

Figure 2:
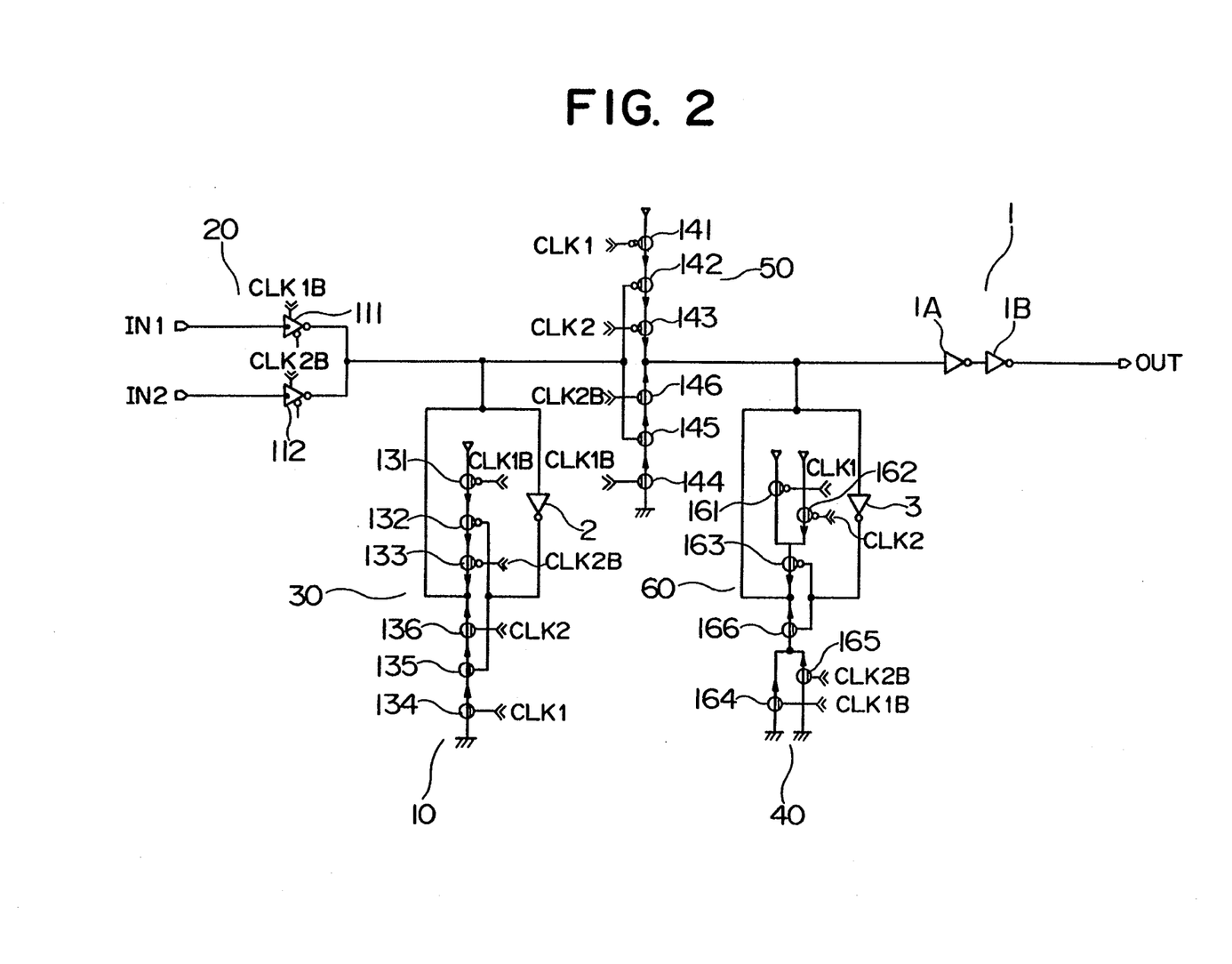
FIG. 2 is a circuit diagram of a first embodiment of the present invention.

Preferred embodiments of the present invention will now be described. FIG. 2 presents a circuit diagram showing the first embodiment of the present invention. Like the conventional memory circuit shown in FIG. 1, this embodiment has a clock signal CLK1, an inverted signal CLK1B of this clock signal CLK and a data signal IN1 as the first input system, and a clock signal CLK2, an inverted signal CLK2B of this clock signal CLK and a data signal IN2 as the second input system. By fixing the clock signal of one system to a logic value 1, the data signal will be held and output in the other system in synchronism with the rising edge of the clock signal of this system.

In the memory circuit of this embodiment, the data signals IN1 and IN2 are respectively input to clocked inverters 111 and 112 whose outputs are both input to a first hold circuit 10 and a second input gate 50. The clocked inverters 111 and 112 are respectively controlled by the inverted signals CLK1B and CLK2B of the clock signals. The output of the second input gate 50 is input to a second hold circuit 40 and an output circuit 1. This output circuit 1, like the one in FIG. 1, comprises an inverter 1A and an inverter 1B.

A description will now be given of vertical lamination inverter which constitute the first hold circuit 10 and second input gate 50, and a horizontal lamination inverter which constitutes the second hold circuit 40. First, the "vertical lamination inverter" is a logic gate having such a structure as that of a first feedback gate 30 of the first hold circuit 10, which comprises six MOS transistors 131, 132, 133, 134, 135 and 136 in FIG. 2. As illustrated, the three p channel (first conductivity type) MOS transistors 131, 132 and 133 are connected in series and are arranged in a row in vertical lamination, with one end of the transistor row connected to a power source potential. The three n channel (second conductivity type) MOS transistors 134, 135 and 136 are connected in series and are arranged in a row in vertical lamination, with one end of the transistor row connected to a ground potential. Both transistor rows are connected between the power source potential and the ground potential, constituting the vertical lamination inverter.

The node between the first input gate 20 and the second input gate 50 is connected to the node between the transistors 133 and 136 of the first feedback gate 30, and is also connected via an inverter 2 to the control-signal input terminals of the transistors 132 and 135.

The transistors 134 and 131 are respectively controlled by the first clock signal CLK1 and its inverted signal CLK1B, and the transistors 136 and 133 are respectively controlled by the second clock signal CLK2 and its inverted signal CLK2B. Therefore, the vertical lamination inverter functions as an inverter only when the clock signals CLK1 and CLK2 both have a logic value 1, and their outputs have a high resistance otherwise. Since this vertical lamination inverter is controlled by a clock signal which is in phase with the clock signal that controls the first input gate 20 constituted of the clocked inverters 111 and 112, no data dropout will occur in this memory circuit.

Likewise, the second input gate 50 comprises six MOS transistors 141, 142, 143, 144, 145 and 146, the first three being p channel MOS transistors and the second three being n channel MOS transistors, all connected between the power source potential and the ground potential. The transistors 141 and 143 are respectively controlled by the clock signals CLK1 and CLK2, while the transistors 144 and 146 are respectively controlled by the inverted signals CLK1B and CLK2B of those clock signals. The first input gate 20 is connected to the control-signal input terminals of the transistors 142 and 145, and the node between the transistors 143 and 146 is connected to the output circuit 1.

The "horizontal lamination inverter" is a logic gate having such a structure as that of a second feedback gate 60 of the second hold circuit 40, which comprises six MOS transistors 161, 162, 163, 164, 165 and 166 in FIG. 2. As illustrated, the p channel MOS transistors 161 and 162 are connected in parallel and are arranged in horizontal lamination, with one end of the parallel circuit connected to the power source potential and the other end connected in series to the p channel MOS transistor 163 in vertical lamination. The n channel MOS transistors 164 and 165 are connected in parallel to be arranged in horizontal lamination, with one end of the parallel circuit connected to the ground potential with the other end connected in series to the n channel MOS transistor 166 in vertical lamination. The transistors 161–163 and the transistors 164–166 are connected between the power source potential and the ground potential, constituting a horizontal lamination inverter.

The node between the second input gate 50 and the output circuit 1 is connected to the node between the transistors 163 and 166 of the second feedback gate 60, and is also connected via an inverter 3 to the control-signal input terminals of the transistors 163 and 166.

The transistors 161 and 164 are respectively controlled by the first clock signal CLK1 and its inverted signal CLK1B, while the transistors 162 and 165 are respectively controlled by the second clock signal CLK2 and its inverted signal CLK2B. Therefore, the horizontal lamination inverter functions as an inverter when either one of the clock signals CLK1 and CLK2 has a logic value 1, and their outputs have a high resistance when those clock signals both have a logic value 0. This horizontal lamination inverter, like the above-described vertical lamination inverter, functions in synchronism with the control clock signal of the first input gate 20.

A detailed description of the operation of this embodiment will now be given, in the case where the data holding operation is executed with respect to a set of the first clock signal CLK1 and the data signal IN1 for descriptive simplicity. That is, it is assumed that the second clock signal CLK2 always has a logic value 1 and its inverted signal CLK2B always has a logic value 0.

The first input gate 20 selects one of two systems of data signals. In this case, the clocked inverter 112, which is controlled by the inverted clock signal CLK2B, is always disabled, thus blocking the second data signal IN2 from the memory circuit. In other words, the first input gate 20 becomes equivalent to a clocked inverter which receives the first data signal IN1 as an input and is controlled by the inverted signal CLK1B of the first clock signal CLK1.

The first feedback loop comprises the first inverting gate 2 and the transistors 131, 132, 133, 134, 135 and 136, which constitute the first feedback gate 30, and holds the output of the first input gate (clocked inverter 111) like the first feedback loop in the conventional memory circuit shown in FIG. 1. In this case, the transistors of the first feedback gate 30, which are respectively controlled by the clock signals CLK2 and CLK2B, are both enabled. The first feedback gate 30 is therefore equivalent to a clocked inverter which receives the output of the first inverting gate 2 as an input and is controlled by the first clock signal CLK1. Thus, the first feedback loop becomes equivalent to the first feedback loop in the conventional memory circuit shown in FIG. 1.

The six MOS transistors 141 to 146 constituting the second input gate 50, like the second input gate 52 in the conventional memory circuit shown in FIG. 1, transfers the output of the first input gate (inverting gate 111) to the second feedback loop. In this case, the transistors 143 and 146, which are respectively controlled by the clock signals CLK2 and CLK2B, are both enabled. The second input gate 50 is therefore equivalent to a clocked inverter which receives the output of the first input gate (clocked inverter 111) as an input and is controlled by the first signal CLK1. Thus, the second input gate 50 becomes equivalent to the second input gate 52 in the conventional memory circuit shown in FIG. 1.

The second feedback loop comprises the second inverting gate 3 and the transistors 161 to 166, which constitute the second feedback gate 60, and holds the output of the second input gate 50 like the second feedback loop in the conventional memory circuit shown in FIG. 1. In this case, the transistors 162 and 165, which are respectively controlled by the clock signals CLK2 and CLK2B, are both disabled. The second feedback gate 60 is therefore equivalent to a clocked inverter which receives the output of the second inverting gate 3 as an input and is controlled by the first clock signal CLK1. Thus, the second feedback loop becomes equivalent to the second feedback loop in the conventional memory circuit shown in FIG. 1.

The inverters 1A and 1B constitute an output buffer, and drive a load circuit at the next stage while reducing the load on the second feedback loop.

As described above, when the second clock signal CLK2 has a logic value 1, this embodiment functions as an ordinary one-input memory circuit, which is triggered by the rising edge of the input, with the first data signal IN1 used as a data signal and the first clock signal CLK1 as a clock signal.

Likewise, when the first clock signal CLK1 is fixed to a logic value 1, this embodiment functions as an ordinary one-input memory circuit, which is triggered by the rising edge of the input, with the second data signal IN2 used as a data signal and the second clock signal CLK2 as a clock signal.

As the control signal for the first input gate 20 functions in phase with the control signal for the second input gate 50 in this embodiment, data dropout will not occur. In the case where the logic value of the clock signal changes from "1" to "0", when the first input gate is enabled, the second input gate is disabled at the same time, preventing any data dropout.

Further, even if there is a skew between the clock signal and its inverted signal, the memory circuit embodying this invention will prevent data dropout. In the case where a p channel MOS transistor and an n channel MOS transistor conduct simultaneously due to the difference between their threshold values when a clock signal with a very dull waveform and its inverted signal are input, data dropout may occur. This comes to the matter of the difference in driving performances of the first feedback loop and the second input gate 50, and will not raise any problem on a practical waveform of the clock signal and the driving power of each gate.

Accordingly, this embodiment will eliminate the need for fine adjustment for preventing data dropout and the need for re-checking.

Figure 3:
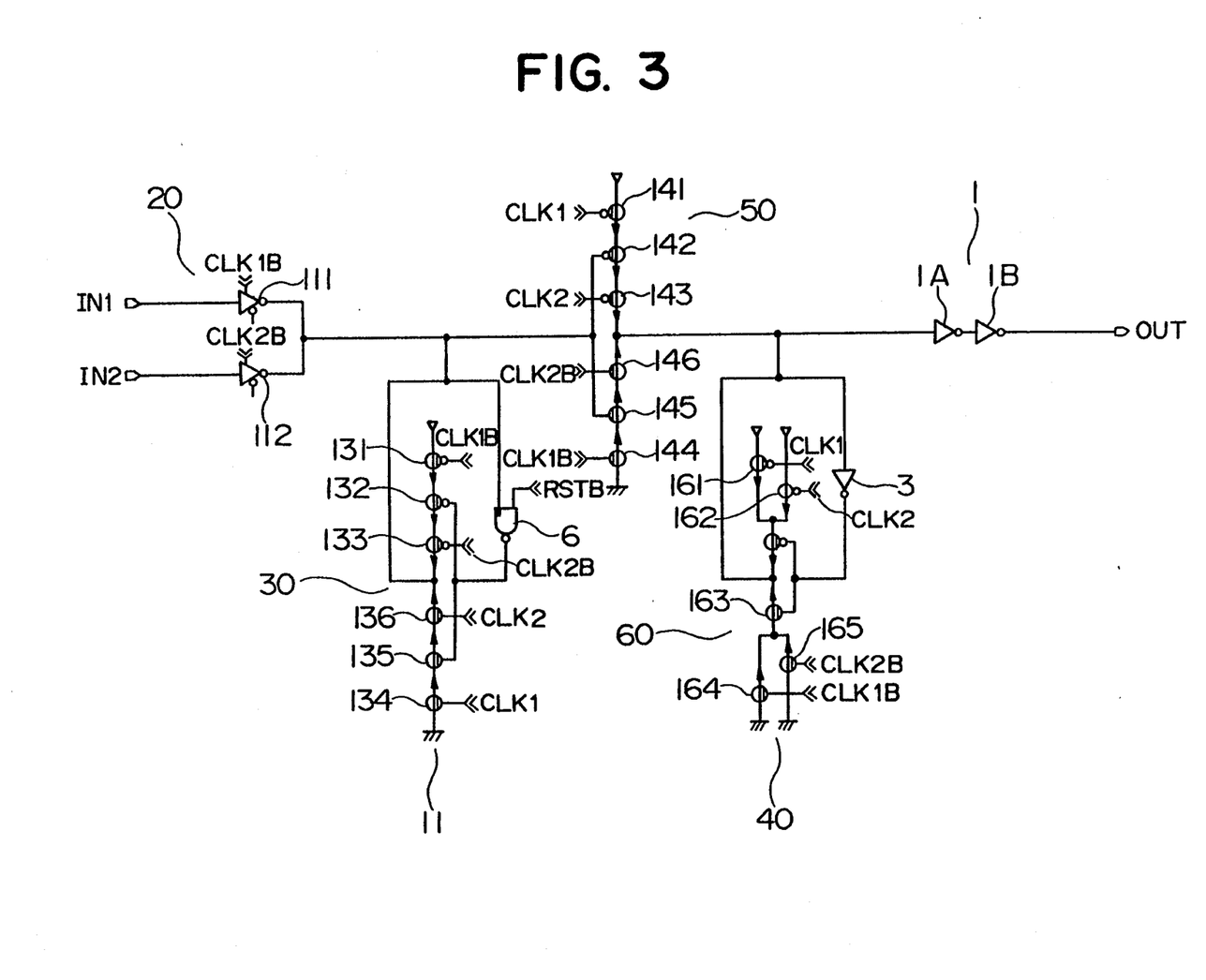
FIG. 3 is a circuit diagram of a second embodiment of the present invention.

The second embodiment of this invention will now be described. FIG. 3 presents a circuit diagram of the second embodiment. In this embodiment, an inverting gate 6 is provided in place of the inverter 2 of the first embodiment, and a reset signal RSTB is added as an input. This embodiment performs the same function as the first embodiment when the reset signal RSTB has a logic value 1, but always outputs a logic value 0 when the reset signal RSTB has a logic value 0.

In this embodiment, the first input gate 20, first feedback gate 30, second input gate 50, second inverting gate 3, second feedback gate 60 and output circuit 1 are identical to those of the first embodiment.

The first inverting gate 6 receives the output of the first input gate 20 as one input and the reset signal RSTB as the other input. When the reset signal RSTB has a logic value 1, this gate 6 functions the same way as an inverter, so that this embodiment becomes an equivalent to the first embodiment. When the reset signal RSTB has a logic value 0, the first inverting gate 6 always outputs "1." Therefore, the first feedback loop always holds a logic value 1, thus allowing the second feedback loop to always hold a logic value 0. Thus, this embodiment always outputs a logic value 0.

As described above, this embodiment will function as a two-input rising-edge trigger type memory circuit which can reset the output by fixing the reset signal RSTB to a logic value 0.

Although the foregoing description has been given with reference to the case where two systems of clock and data signals are handled, this invention will also have the same advantages in the case where more than two systems of clock and data signals are handled. In other words, this invention can easily be adapted for a multi-system circuit by providing the vertically-laminated transistors in the vertical lamination inverter, which are controlled by the first and second control signals, in the same number of stages as the number of systems of clock signals, and providing the horizontally-laminated transistors in the horizontal lamination inverter, which are controlled by the first and second control signals, in the same number of stages as the number of systems of clock signals.

Although the foregoing description of this invention has discussed a rising-edge trigger type memory circuit, a falling-edge trigger type memory circuit can easily be designed by replacing all the clock signals with their inverted signals and vice versa.

What is claimed is:

1. A multi-input memory circuit for receiving a plurality of clock signals and a plurality of data signals paired respectively with said plurality of clock signals, and selectively using an arbitrary set of clock and data signals to store and output data, comprising:

a first input gate for receiving inverted signals of said plurality of clock signals and said plurality of data signals, and selectively outputting one of said plurality of data signals based on said inverted signals of said plurality of clock signals;

a first feedback loop having a first inverting gate and a first feedback gate having an input terminal connected to an output terminal of said first inverting gate and an output terminal connected to an input terminal thereof, said input terminal of said first inverting gate and said output terminal of said first feedback gate being connected to an output terminal of said first input gate;

a second input gate for receiving a data from said first input gate and said first feedback loop and outputting an inverted data of said data; and a second feedback loop having a second inverting gate and a second feedback gate having an input terminal connected to an output terminal of said second inverting gate and an output terminal connected to an input terminal thereof, said input terminal of said second inverting gate and said output terminal of said second feedback gate being connected to an output terminal of said second input gate;

said first feedback gate including a first transistor row having a series circuit having series-connected first conductivity type MOS transistors for receiving said inverted signals of said plurality of clock signals respectively as gate inputs, and a first conductivity type MOS transistor for receiving an output of said first inverting gate as a gate input, said series circuit of first conductivity type MOS transistors being connected in series to said latter first conductivity type MOS transistor, and a second transistor row having a series circuit having series-connected second conductivity type MOS transistors for receiving said plurality of clock signals respectively as gate inputs, and a second conductivity type MOS transistor for receiving said output of said first inverting gate as a gate input, said series circuit of second conductivity type MOS transistors being connected in series to said latter second conductivity type MOS transistor, a drain electrode of a first end of said first transistor row and a drain electrode of a first end of said second transistor row being connected together to be an output terminal, a source electrode of a second end of said first transistor row being fixed to a potential of a high-potential power source, and a source electrode of a second end of said second transistor row being fixed to a ground potential.

2. The multi-input memory circuit according to claim 1, wherein said second input gate including a third transistor row having a series circuit having series-connected first conductivity type MOS transistors for receiving said plurality of clock signals respectively as gate inputs, and a first conductivity type MOS transistor for receiving said output of said first input gate as a gate input, said series circuit of first conductivity type MOS transistors being connected in series to said latter first conductivity type MOS transistor, and a fourth transistor row having a series circuit having series-connected second conductivity type MOS transistors for receiving inverted signals of said plurality of clock signals respectively as gate inputs, and a second conductivity type MOS transistor for receiving said output of said first input gate and said first feedback loop as a gate input, said series circuit of second conductivity type MOS transistors being connected in series to said latter second conductivity type MOS transistor, a drain electrode of a first end of said third transistor row and a drain electrode of a first end of said fourth transistor row being connected together to be an output terminal, a source electrode of a second end of said third transistor row being fixed to said potential of said high-potential power source, and a source electrode of a second end of said fourth transistor row being fixed to said ground potential.

3. The multi-input memory circuit according to claim 1, wherein said second feedback gate including a fifth transistor row having a parallel circuit having parallel-connected first conductivity type MOS transistors for receiving said plurality of clock signals respectively as gate inputs, and a first conductivity type MOS transistor for receiving an output of said second inverting gate as a gate input, said parallel circuit of first conductivity type MOS transistors being connected in series to said latter first conductivity type MOS transistor, and a sixth transistor row having a parallel circuit having parallel-connected second conductivity type MOS transistors for receiving inverted signals of said plurality of clock signals respectively as gate inputs, and an second conductivity type MOS transistor for receiving said output of said second inverting gate as a gate input, said parallel circuit of second conductivity type MOS transistors being connected in series to said latter second conductivity type MOS transistor, a drain electrode of a first end of said fifth transistor row and a drain electrode of a first end of said sixth transistor row being connected together to be an output terminal, a source electrode of a second end of said fifth transistor row being fixed to said potential of said high-potential power source, and a source electrode of a second end of said sixth transistor row being fixed to said ground potential.

4. The multi-input memory circuit according to claim 2, wherein said second feedback gate including a fifth transistor row having a parallel circuit having parallel-connected first conductivity type MOS transistors for receiving said plurality of clock signals respectively as gate inputs, and a first conductivity type MOS transistor for receiving an output of said second inverting gate as a gate input, said parallel circuit of first conductivity type MOS transistors being connected in series to said latter first conductivity type MOS transistor, and a sixth transistor row having a parallel circuit having parallel-connected second conductivity type MOS transistors for receiving inverted signals of said plurality of clock signals respectively as gate inputs, and a second conductivity type MOS transistor for receiving said output of said second inverting gate as a gate input, said parallel circuit of second conductivity type MOS transistors being connected in series to said latter second conductivity type MOS transistor, a drain electrode of a first end of said fifth transistor row and a drain electrode of a first end of said sixth transistor row being connected together to be an output terminal, a source electrode of a second end of said fifth transistor row being fixed to said potential of said high-potential power source, and a source electrode of a second end of said sixth transistor row being fixed to said ground potential.

5. A multi-input memory circuit for receiving a plurality of clock signals and a plurality of data signals paired respectively with said plurality of clock signals, and selectively using an arbitrary set of clock and data signals to store and output data, comprising:

a first input gate for receiving inverted signals of said plurality of clock signals and said plurality of data signals, and selectively outputting one of said plurality of data signals based on said inverted signals of said plurality of clock signals;

a first feedback loop having a first inverting gate and a first feedback gate having an input terminal connected to an output terminal of said first inverting gate and an output terminal connected to an input terminal thereof, said input terminal of said first inverting gate and said output terminal of said first feedback gate being connected to an output terminal of said first input gate;

a second input gate for receiving a data from said first input gate or said first feedback loop and outputting an inverted data of said data; and a second feedback loop having a second inverting gate and a second feedback gate having an input terminal connected to an output terminal of said second inverting gate and an output terminal connected to an input terminal thereof, said input terminal of said second inverting gate and said output terminal of said second feedback gate being connected to an output terminal of said second input gate;

said second input gate including a third transistor row having a series circuit having series-connected first conductivity type MOS transistors for receiving said plurality of clock signals respectively as gate inputs, and a first conductivity type MOS transistor for receiving said output of said first input gate as a gate input, said series circuit of first conductivity type MOS transistors being connected in series to said latter first conductivity type MOS transistor, and a fourth transistor row having a series circuit having series-connected second conductivity type MOS transistors for receiving inverted signals of said plurality of clock signals respectively as gate inputs, and a second conductivity type MOS transistor for receiving said output of said first input gate and said first feedback loop as a gate input, said series circuit of second conductivity type MOS transistors being connected in series to said latter second conductivity type MOS transistor, a drain electrode of a first end of said third transistor row and a drain electrode of a first end of said fourth transistor row being connected together to be an output terminal, a source electrode of a second end of said third transistor row being fixed to a potential of a high-potential power source, and a source electrode of a second end of said fourth transistor row being fixed to a ground potential.

6. The multi-input memory circuit according to claim 5, wherein said second feedback gate including a fifth transistor row having a parallel circuit having parallel-connected first conductivity type MOS transistors for receiving said plurality of clock signals respectively as gate inputs, and a first conductivity type MOS transistor for receiving an output of said second inverting gate as a gate input, said parallel circuit of first conductivity type MOS transistors being connected in series to said latter first conductivity type MOS transistor, and a sixth transistor row having a parallel circuit having parallel-connected second conductivity type MOS transistors for receiving inverted signals of said plurality of clock signals respectively as gate inputs, and a second conductivity type MOS transistor for receiving said output of said second inverting gate as a gate input, said parallel circuit of second conductivity type MOS transistors being connected in series to said latter second conductivity type MOS transistor, a drain electrode of a first end of said fifth transistor row and a drain electrode of a first end of said sixth transistor row being connected together to be an output terminal, a source electrode of a second end of said fifth transistor row being fixed to said potential of said high-potential power source, and a source electrode of a second end of said sixth transistor row being fixed to said ground potential.

7. A multi-input memory circuit for receiving a plurality of clock signals and a plurality of data signals paired respectively with said plurality of clock signals, and selectively using an arbitrary set of clock and data signals to store and output data, comprising:
a first input gate for receiving inverted signals of said plurality of clock signals and said plurality of data signals, and selectively outputting one of said plurality of data signals based on said inverted signals of said plurality of clock signals;
a first feedback loop having a first inverting gate and a first feedback gate having an input terminal connected to an output terminal of said first inverting gate and an output terminal connected to an input terminal thereof, said input terminal of said first inverting gate and said output terminal of said first feedback gate being connected to an output terminal of said first input gate;
a second input gate for receiving a data from said first input gate or said first feedback loop and outputting an inverted data of said data; and
a second feedback loop having a second inverting gate and a second feedback gate having an input terminal connected to an output terminal of said second inverting gate and an output terminal connected to an input terminal thereof, said input terminal of said second inverting gate and said output terminal of said second feedback gate being connected to an output terminal of said second input gate;
said second feedback gate including a fifth transistor row having a parallel circuit having parallel-connected first conductivity type MOS transistors for receiving said plurality of clock signals respectively as gate inputs, and a first conductivity type MOS transistor for receiving an output of said second inverting gate as a gate input, said parallel circuit of first-conductivity type MOS transistors being connected in series to said latter first conductivity type MOS transistor, and a sixth transistor row having a parallel circuit having parallel-connected second conductivity type MOS transistors for receiving inverted signals of said plurality of clock signals respectively as gate inputs, and a second conductivity type MOS transistor for receiving said output of said second inverting gate as a gate input, said parallel circuit of second conductivity type MOS transistors being connected in series to said latter second conductivity type MOS transistor, a drain electrode of a first end of said fifth transistor row and a drain electrode of a first end of said sixth transistor row being connected together to be an output terminal, a source electrode of a second end of said fifth transistor row being fixed to a potential of a high-potential power source, and a source electrode of a second end of said sixth transistor row being fixed to a ground potential.

8. The multi-input memory circuit according to claim 1, wherein said first input gate has a first clocked inverter, which receives a first data signal and is controlled by an inverted signal of a first clock signal, and a second clocked inverter, which receives a second data signal and is controlled by an inverted signal of a second clock signal, output ends of said first and second clocked inverters being connected together.

9. The multi-input memory circuit according to claim 1, wherein said first inverting gate is an inverter.

10. The multi-input memory circuit according to claim 1, wherein said first inverting gate is a logic circuit for receiving an input signal as one input and a reset signal as another input and outputting said input signal after inversion when said reset signal has a logic value 1 and outputting a logic value 0 when said reset signal has a logic value 0.

11. The multi-input memory circuit according to claim 2, wherein said first input gate has a first clocked inverter, which receives a first data signal and is controlled by an inverted signal of a first clock signal, and a second clocked inverter, which receives a second data signal and is controlled by an inverted signal of a second clock signal, output ends of said first and second clocked inverters being connected together.

12. The multi-input memory circuit according to claim 2, wherein said first inverting gate is an inverter.

13. The multi-input memory circuit according to claim 2, wherein said first inverting gate is a logic circuit for receiving an input signal as one input and a reset signal as another input and outputting said input signal after inversion when said reset signal has a logic value 1 and outputting a logic value 0 when said reset signal has a logic value 0.

14. The multi-input memory circuit according to claim 3, wherein said first input gate has a first clocked inverter, which receives a first data signal and is controlled by an inverted signal of a first clock signal, and a second clocked inverter, which receives a second data signal and is controlled by an inverted signal of a second clock signal, output ends of said first and second clocked inverters being connected together.

15. The multi-input memory circuit according to claim 3, wherein said first inverting gate is an inverter.

16. The multi-input memory circuit according to claim 3, wherein said first inverting gate is a logic circuit for receiving an input signal as one input and a reset signal as another input and outputting said input signal after inversion when said reset signal has a logic value 1 and outputting a logic value 0 when said reset signal has a logic value 0.

17. The multi-input memory circuit according to claim 4, wherein said first input gate has a first clocked inverter, which receives a first data signal and is controlled by an inverted signal of a first clock signal, and a second clocked inverter, which receives a second data signal and is controlled by an inverted signal of a second clock signal, output ends of said first and second clocked inverters being connected together.

18. The multi-input memory circuit according to claim 4, wherein said first inverting gate is an inverter.

19. The multi-input memory circuit according to claim 4, wherein said first inverting gate is a logic circuit for receiving an input signal as one input and a reset signal as another input and outputting said input signal after inversion when said reset signal has a logic value 1 and outputting a logic value 0 when said reset signal has a logic value 0.

20. The multi-input memory circuit according to claim 1, wherein said first conductivity type is p channel and said second conductivity type is n channel.

* * * * *